United States Patent
Ryou et al.

(10) Patent No.: US 10,476,234 B2
(45) Date of Patent: Nov. 12, 2019

(54) EXTERNALLY-STRAIN-ENGINEERED SEMICONDUCTOR PHOTONIC AND ELECTRONIC DEVICES AND ASSEMBLIES AND METHODS OF MAKING SAME

(71) Applicant: University of Houston System, Houston, TX (US)

(72) Inventors: Jae-Hyun Ryou, Katy, TX (US); Shahab Shervin, Houston, TX (US); Seung Hwan Kim, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 0 days.

(21) Appl. No.: 15/562,462

(22) PCT Filed: Apr. 8, 2016

(86) PCT No.: PCT/US2016/026707
§ 371 (c)(1),
(2) Date: Sep. 28, 2017

(87) PCT Pub. No.: WO2016/164765
PCT Pub. Date: Oct. 13, 2016

(65) Prior Publication Data
US 2018/0090911 A1  Mar. 29, 2018

Related U.S. Application Data

(60) Provisional application No. 62/144,715, filed on Apr. 8, 2015.

(51) Int. Cl.
*H01L 29/84* (2006.01)
*H01S 5/32* (2006.01)
(Continued)

(52) U.S. Cl.
CPC .... *H01S 5/3201* (2013.01); *H01L 21/823807* (2013.01); *H01L 21/823814* (2013.01);
(Continued)

(58) Field of Classification Search
CPC ... H01S 5/32; H01S 5/323; H01S 5/34; H01L 21/8238; H01L 29/49; H01L 29/78
See application file for complete search history.

(56) References Cited

U.S. PATENT DOCUMENTS

| 5,373,166 A | 12/1994 | Buchan et al. |
| 2003/0102482 A1 | 6/2003 | Saxler |

(Continued)

FOREIGN PATENT DOCUMENTS

| JP | WO 2016002157 A1 * | 1/2016 | ....... H01L 21/02428 |
| WO | WO-2015135691 A1 * | 9/2015 | ........... G01L 9/0045 |

OTHER PUBLICATIONS

PCT/US2016/026707 International Search Report and Written Opinion dated Sep. 1, 2016 (17 p.).

*Primary Examiner* — Matthew C Landau
*Assistant Examiner* — Dmitriy Yemelyanov
(74) *Attorney, Agent, or Firm* — Conley Rose, P.C.

(57) ABSTRACT

Externally-strained devices such as LED and FET structures as discussed herein may have strain applied before or during their being coupled to a housing or packaging substrate. The packaging substrate may also be strained prior to receiving the structure. The strain on the devices enables modulation of light intensity, color, and electrical currents in some embodiments, and in alternate embodiments, enables a fixed strain to be induced and maintained in the structures.

15 Claims, 16 Drawing Sheets

(51) Int. Cl.
    *H01L 29/778*      (2006.01)
    *H01L 29/06*       (2006.01)
    *H01L 21/8238*     (2006.01)
    *H01L 29/49*       (2006.01)
    *H01L 29/78*       (2006.01)
    *H01S 5/323*       (2006.01)
    *H01S 5/34*        (2006.01)
    *H01L 29/10*       (2006.01)
    *H01L 29/20*       (2006.01)
    *H01L 29/22*       (2006.01)
    *H01L 33/02*       (2010.01)
    *H01L 33/48*       (2010.01)

(52) U.S. Cl.
    CPC .. *H01L 21/823835* (2013.01); *H01L 29/0657* (2013.01); *H01L 29/4908* (2013.01); *H01L 29/7786* (2013.01); *H01L 29/7845* (2013.01); *H01L 29/84* (2013.01); *H01S 5/32391* (2013.01); *H01S 5/3406* (2013.01); *H01L 29/1054* (2013.01); *H01L 29/2003* (2013.01); *H01L 29/22* (2013.01); *H01L 33/02* (2013.01); *H01L 33/486* (2013.01)

(56) References Cited

U.S. PATENT DOCUMENTS

| | | | |
|---|---|---|---|
| 2004/0056273 A1* | 3/2004 | Nause | H01L 29/22 |
| | | | 257/194 |
| 2005/0042579 A1 | 2/2005 | Carr | |
| 2005/0245017 A1 | 11/2005 | Belyansky et al. | |
| 2006/0214193 A1* | 9/2006 | Hayamura | H01L 29/66462 |
| | | | 257/213 |
| 2007/0120208 A1* | 5/2007 | Mitra | H01L 29/1029 |
| | | | 257/417 |
| 2008/0176367 A1 | 7/2008 | Noguchi et al. | |
| 2012/0094470 A1* | 4/2012 | Bensahel | H01L 29/78 |
| | | | 438/457 |
| 2015/0053927 A1 | 2/2015 | Arnold et al. | |
| 2017/0097270 A1* | 4/2017 | Daves | G01L 9/0045 |
| 2017/0098703 A1* | 4/2017 | Ogawa | H01L 21/02428 |

* cited by examiner

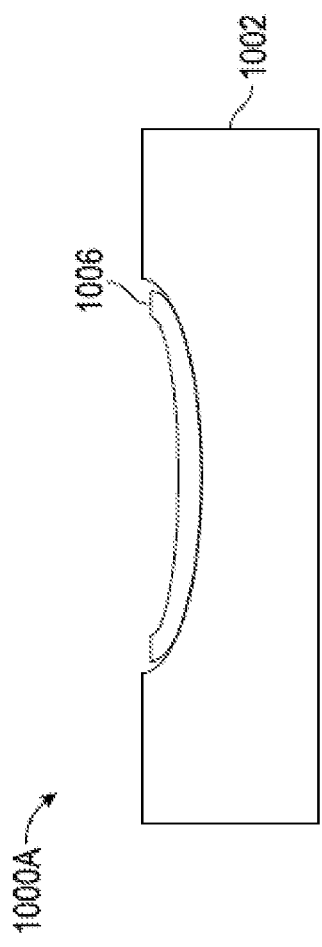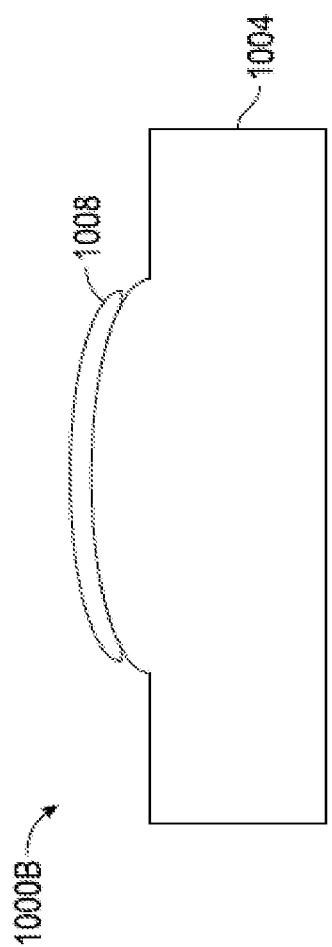

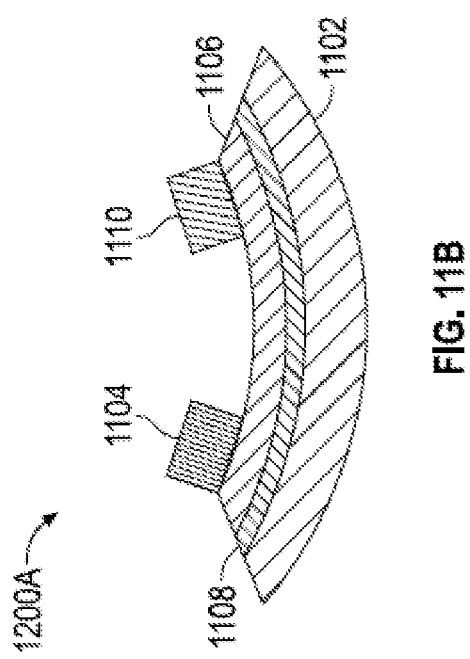

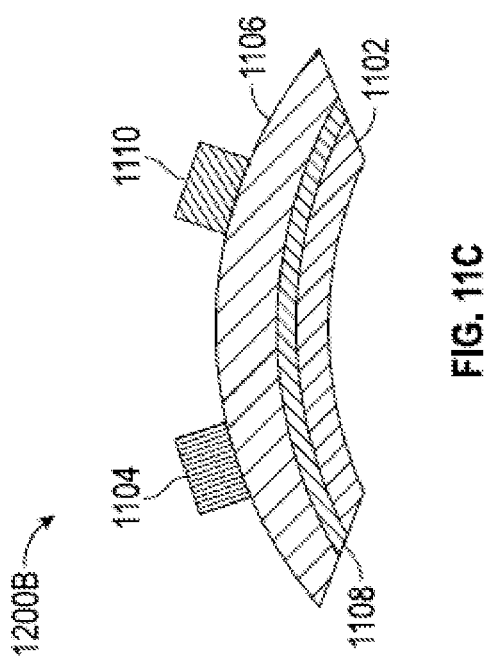

EXTERNALLY-STRAIN-ENGINEERED SEMICONDUCTOR PHOTONIC AND ELECTRONIC DEVICES AND ASSEMBLIES AND METHODS OF MAKING SAME

CROSS-REFERENCE TO RELATED APPLICATIONS

This application is a 35 U.S.C. § 371 national stage application of PCT/US2016/026707 filed Apr. 8, 2016, and entitled "Externally-Strain-Engineered Semiconductor Photonic and Electronic Devices and Assemblies and Methods of Making Same," which claims priority to U.S. Provisional Patent Application No. 62/144,715, "Externally-Strain-Engineered Semiconductor Photonic and Electronic Devices and Assemblies and Methods of Making Thereof," filed Apr. 8, 2015, each of which is incorporated by reference in its entirety herein for all purposes.

STATEMENT REGARDING FEDERALLY SPONSORED RESEARCH OR DEVELOPMENT

Not applicable.

BACKGROUND

Solid-state lighting technology may be employed in automobile lighting, building lighting, traffic lights, and other lighting system, and employs semiconductor light-emitting diodes (LEDs) or other light-emitting diodes such as polymer or organic diodes. Solid-state lighting is distinct from other types of lighting such as fluorescent lighting that may use plasma, or other lighting that may instead employ gas or filaments. Solid-state lighting emits solid-state electroluminescence that creates visible light without the concerns of excessive heat generation or parasitic energy dissipation. Beyond lighting applications, solid-state devices may be employed in power electronics where electrical power is controlled and converted. Higher voltage and higher power devices are necessary and may be in higher demand in future applications, including smart grid systems as well as hybrid and electric vehicles.

BRIEF SUMMARY OF THE DISCLOSURE

In an embodiment, a mounted field-effect transistor comprising: a layered structure comprising a first layer disposed in contact with a second layer; a channel at the interface of the first layer and the second layer, wherein the channel comprises a high density of electrons; at least a first and a second electrode in contact with the first layer and free of contact with the second layer, wherein the layered structure is in one of a bend-up or bend-down condition and comprises a predetermined amount of strain; and a packaging substrate, wherein the layered structure is disposed in contact with the packaging substrate and retains at least some of the predetermined amount of strain subsequent to disposal.

In an embodiment, a method of modulating electrical current comprising: disposing a first layer in contact with a second layer; forming a channel at the interface of the first layer and the second layer; disposing at least a first and a second electrodes in contact with the first layer to form a transistor; inducing strain in the transistor, wherein inducing the strain comprises applying strain to the transistor in at least one strain cycle, whereby the transistor retains a predetermined amount of strain subsequent to the at least one strain cycle; disposing the transistor in a housing in a manner such that the transistor retains the predetermined amount of strain subsequent to disposal in the housing; and subsequent to disposing the transistor in the housing, changing an amount of strain on the channel, wherein an electrical current in the transistor is modulated by changing the amount of the strain on the channel.

In an embodiment, a method of manufacturing a device, comprising: forming a plurality of light-emitting devices, wherein forming each light-emitting device of a plurality of the light-emitting device comprises: disposing a p-type electrode in contact with a p-type semiconductor layer; disposing a light-active region between the p-type semiconductor layer and at least one n-type semiconductor layer; and disposing an n-type electrode in contact with the n-type semiconductor layer; and applying strain in at least one strain cycle to each light-emitting device of the plurality of light-emitting devices, wherein each light-emitting device retains a predetermined amount of strain subsequent to the at least one strain cycle to produce at least one of a bend-up or a bend-down condition in the light-emitting device.

Embodiments described herein comprise a combination of features and characteristics intended to address various shortcomings associated with certain prior devices, compositions, systems, and methods. The various features and characteristics described above, as well as others, will be readily apparent to those of ordinary skill in the art upon reading the following detailed description, and by referring to the accompanying drawings.

BRIEF DESCRIPTION OF THE DRAWINGS

FIGS. 10A and 10B illustrate two embodiments of an externally-strained semiconductor structure disposed on a packaging substrate.

FIGS. 11A-11C illustrate the unbent, bend-up, and bend-down conditions of strain-effect transistor (SET) structures fabricated according to embodiments of the present disclosure.

DETAILED DESCRIPTION OF THE DISCLOSED EXEMPLARY EMBODIMENTS

Figure 1:
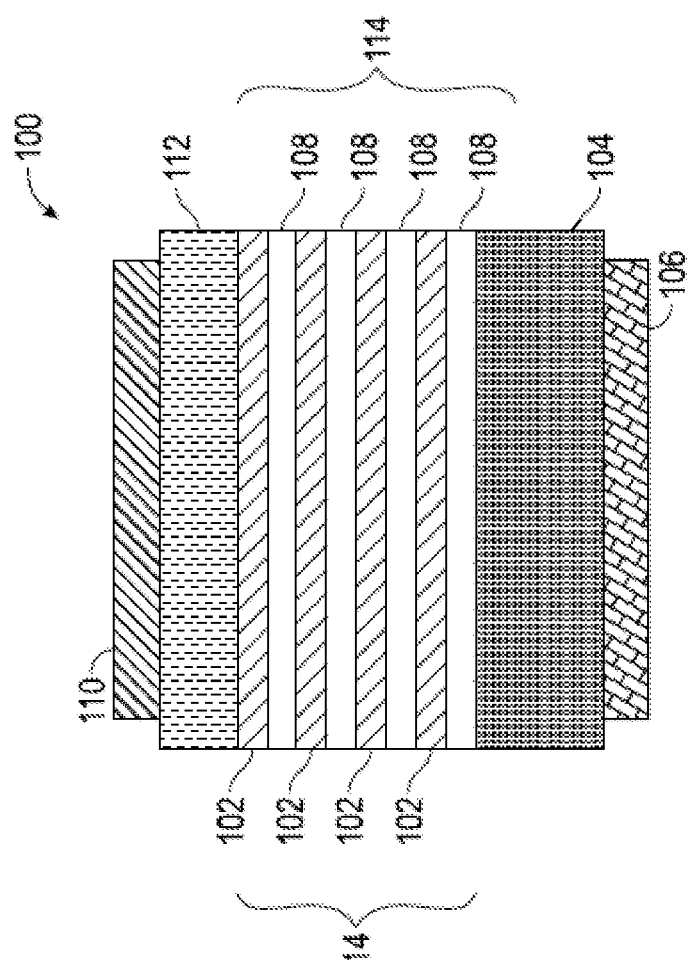
FIG. 1 illustrates a cross-sectional structure of an un-bent visible, infrared (IR), and ultraviolet (UV) light-emitting device (or light-emitting diodes, LED).

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . "

By this express reference, "Externally-Strain-Engineered Semiconductor Photonic and Electronic Devices and Methods of Making Thereof," by Jae-Hyun Ryou, Shahab Shervin, and Seung Hwan Kim, is incorporated in its entirety herein; "Threshold Voltage Control of InAlN/GaN Heterostructure Field-Effect Transistors for Depletion- and Enhancement-mode Operation," by Suk Choi, Hee Jni Kim, Zachary Lochner, Yun Zhang, Yi-Che Lee, Shyh-Chiang Shen, Jae-Hyun Ryou, and Russell Dupuis, is also incorporated in its entirety by express reference; "Control of Quantum-Confined Stark Effect I InGaN-Based Quantum Wells," by Jae-Hyun Ryou, P. Douglas Yoder, Jianping Liu, Zachary Lochner, Hyunsoo Kim, Suk Choi, Hee Jin Kim, and Russell D. Dupuis, is also incorporated in its entirety by express reference; and, "Waterproof AlInGaP Optoelectronics on Stretchable Substrates with Applications in Biomedicine and Science," Rak-Hwan Kim, Dae-Hyeong Kim, Jianliang Xiao, Bong Hoon Kim, Sang-Il Park, Bruce Panilaitis, Roozbeh Ghaffari[5], Jimin Yao[6], Ming Li, Zhuangjian Liu, Viktor Malyarchuk, Dae Gon Kim, An-Phong Le, Ralph G. Nuzzo, David L. Kaplan, Fiorenzo G. Omenetto, Yonggang Huang, Zhan Kang, and John A. Rogers is also incorporated in its entirety by express reference.

In the U.S., approximately 22% of total generated electricity is consumed in lighting, and energy saving in lighting is expected to be significant for green way of energy consumption. Solid-state lighting (SSL) lamps based on light-emitting diode (LED) technology are widely acknowledged presently to be the best choice of sustainable lighting technology. The levels of efficiency and reliability achieved by LEDs today are far superior to those of traditional light sources. Typical efficacy of white LED lamp is approximately 120 lumens per watt (lm/W), which is higher than those of compact fluorescent lamps (60-80 lm/W) and incandescent sources (11-17 lm/W). The life span of a typical LED bulb is expected to be longer than 8 years. SSL lamps based on LED technology enable very low ownership cost (offering economic benefit) and produce low carbon footprints (offering environmental benefits). Visible LEDs are conventionally used in full-color display, automotive lighting, traffic light, liquid-crystal display (LCD) back-light unit, and other solid state lighting applications.

Figure 2:
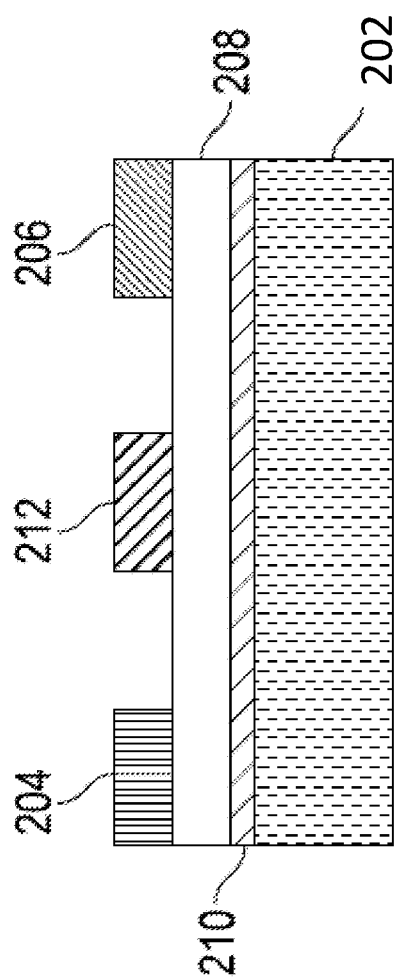
FIG. 2 illustrates a cross-section of an un-bent heterostructure field effect transistor (HFET or FET for field-effect transistors in short), also referred to as high-electron mobility transistors (HEMT).
Figure 11A:
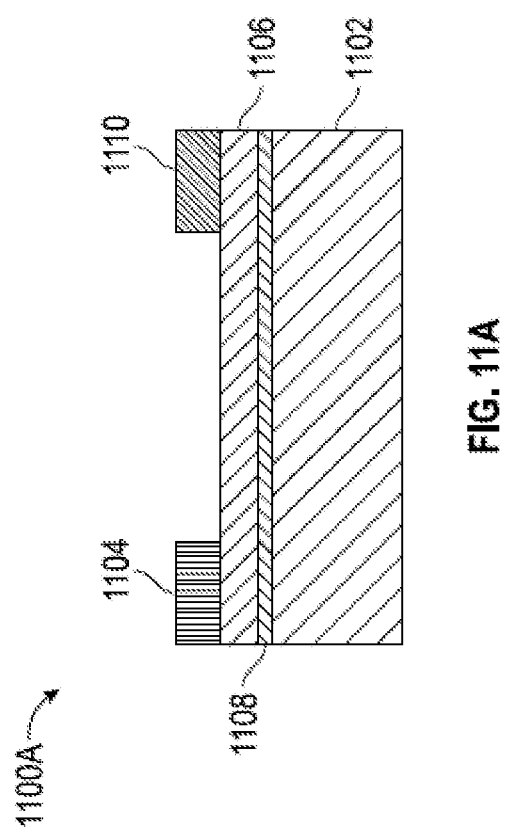

Discussed herein are systems and methods aimed at improving performance characteristics and functionalities of photonic and electronic devices. These devices comprise semiconductor materials with polarization properties and are fabricated to address technical challenges in next-generation solid-state lighting, electronics, electro-mechanics, and photonics. In an embodiment, electronic band structures of polar semiconductors have a layer that consists of anions or cations on a surface such as GaN-based ($Al_xGa_yIn_{1-x-y}N$) and ZnO-based ($Mg_xZn_yCd_{1-x-y}O$) materials, this layer may be engineered for multifunctional and/or high-performance devices by external strains. As used herein, "external strain" means a strain applied to a device structure such as an LED or FET that induces a predetermined amount of strain (first state) and leaves the structure in a bent condition (second state), similar to what is discussed in FIGS. 11B, 11C, 12A, and 12B, below in contrast to the un-bent structures in at least FIGS. 1, 2, and 11A, which are illustrated for reference to show the components of the respective structures. Conventionally, visible, infrared (IR), and ultraviolet (UV) LEDs and FETs may be flat structures (as indicated in FIGS. 1, 2, and 11A).

Devices fabricated according to embodiments of the present disclosure have retained a predetermined amount of external strain that is applied prior to and/or during mounting the device(s) to a packaging substrate. At least two types of devices are discussed herein, light-emitting devices (LEDs) and field-effect transistors (FETs) that may be of varying types including heterostructure field-effect transistors (HFET). An LED fabricated according to embodiments of the present disclosure may comprise a high internal quantum efficiency (IQE) due to fixed eternal strain, or may comprise external strain that may be varied in order to change the wavelengths (color) of the light generated by the LED(s). The wavelength (color) of the LED(s) includes wavelengths in the IR and UV ranges as well as within the visible color range.

An HFET may comprise a source, drain, and gate as discussed below and may comprise an external strain, FETs with source and drains but with no gate may be modulated by variable external strain and may be referred to as strain-effect transistors. An FET that has had external strain applied and has no gate may be referred to as a strain-effect transistor ("SET").

The technologies disclosed herein address critical issues in solid-state lighting applications, smart-grid system, and power electronics. Specifically, concepts introduced herein include visible, IR, and UV LEDs having high quantum efficiencies (QE) in wide-range of operating currents with color-changing capability, as well as, transistors that can be controlled by external strain, that is, strain-effect transistors (SETs). The effects of polarizations in III-N materials have both technical challenges and benefits in the devices. These effects also play a role similar to other materials having polarization properties including II-VI-based semiconductors, for example, ZnO. Therefore, the following discussion on the operating principle focuses on III-N materials as an exemplary embodiment, but the concepts and principles disclosed herein are not limited to III-N materials.

Strained heteroepitaxial growth works well only for the growth along a c-direction of the wurtzite structure on (0001) planes. Hence, most III-N devices are grown epitaxially in a polar direction with a Group-Ill-element-terminated surface such as gallium (Ga)-polar. Such material structures contain spontaneous and piezoelectric polarizations, which induce charges at the interfaces and resulting gradient in electronic band structure of the layers. This is commonly called band bending, a term conventionally used to describe local changes in energy offset near the junction of a semiconductor's band structure, which results in bending observed in band diagrams which are plots of energy vs. distance. Conventionally, "band bending" does not refer to the physical bending of a structure such as the method used to fabricate an entire externally strained semiconductor structures described herein. To avoid the confusion between electronic band bending and semiconductor structure bending by applying external strain, the term "band tilt" may be used herein to refer to the electronic band bending and the "bending" the occurs in response to the application of external strain is a bending (displacement from an initial flat position) of a semiconductor structure. The band tilt results in quantum-confined Stark effect (QCSE) in InGaN/GaN quantum wells (QW) of LEDs and 2-DEG in InAlGaN/GaN HFETs. The QCSE in QWs is one of the technical challenges to be overcome. It is related to a reduced radiative recombination rates and also possibly one of the origins of efficiency droop in visible LEDs. In an attempt to avoid or mitigate the QCSE, epitaxial growth in non-polar and semi-polar directions has been marginally successful only on native substrates. This approach may not be easily implemented in real-life devices due to very expensive and low-throughput nature of the native substrates. The band tilt in HEMTs has provided the benefit in depletion-mode (normally-on) transistors. However, band tilting poses technical challenges for the development of enhancement-mode (normally-off) transistors that are preferred in power-switching applications. The engineering of polarization has been focused mainly on the effects from differential spontaneous polarization and lattice strain set by difference in layers of epitaxial structures. There was not a great degree of freedom in the engineering of polarization, unless an epitaxial structure was modified. In this disclosure, the polarization effects beyond the limit of lattice strain created by applying external strain in flexible III-N structures are discussed. These externally-strained structures may be employed in various devices for multiple functionalities and performance improvements.

Light-Emitting Diodes (LEDs)

In an embodiment, external strain may be applied to one or more LEDs simultaneously. The LED may have a high internal quantum efficiency (IQE) subsequent to the application of strain. This application of strain may occur before, during, or both before and during coupling/mounting the LED in a packaging component. The LED may retain a predetermined amount of the applied strain, which may be applied in one or more strain cycles as discussed herein. This retained strain may be referred to as a "fixed external strain" or "fixed strain."

In another embodiment, LEDs may comprise red, green, blue (RGB) colors, and the external strain that is applied to and retained by the LED may be selected in part on the color of the LED. These LEDs that comprise RGB colors may be used in various combinations to produce white LED light. In alternate embodiments, LEDs comprising external strain may comprise variable external strain and may be modulated (controlled, color-changed) using this variable external strain. These devices that have external strain that may or may not be variable external strain may collectively be referred to as "externally strained devices," "externally strained structures," or "externally strained components." In some embodiments, the substrate may be fabricated in order to induce and/or maintain an optimum amount of strain on the LED or other structure such as an FET as discussed herein, if the strain is variable in a strained FET, it may be referred to as an SET. In some embodiments, the LED structure is pre-strained prior to assembly with the packaging substrate, and in alternate embodiments the LED or FET structure is strained when coupled to or otherwise disposed on the packaging substrate. In other embodiments, the LED or FET structure may be strained prior to and during the disposal/coupling with the packaging substrate Field-Effect Transistors (FETs) and Strain-Effect Transistors (SET)

In an embodiment, a field-effect transistor (FET) may also have external strain applied and may retain at least some of the applied strain, which may be applied in one or more cycles. In an embodiment, the FET may comprise a source electrode (source), a drain electrode (drain), and a gate electrode (gate). In this embodiment, external strain applied to the FET may create a predetermined strain that may be a fixed strain. In some embodiments, FETs may comprise a variable external strain, in contrast to a fixed strain, that may be used to enable modulation of electrical currents using strain applied to a transistor's channel, instead of a gate. These structures may be referred to herein as "strain-effect transistors" (SETs).

In particular, discussed herein are (1) optical output power and efficiency of visible, IR, and UV light-emitting diodes (LEDs) are improved by optimum bending of semiconductor structures; (2) emission wavelength of LED which are changed by external strain which is related to wavelength-tunable LEDs; (3) red, green, blue (R/G/B) LEDs and other LEDs with different colors are realized from the same materials by corrugated and other-form semiconductor structures for phosphor-free white LEDs; (4) conductivity in a channel of transistors is modulated by bending of semiconductor structures; (5) a new device named a strain-effect transistor (SET). The new concepts and processes are expected to provide a solution that can overcome certain technological limitations in current energy-saving devices and systems.

Semiconductor materials are a building block of photonics and electronics that enable current information technology and have potential for next-generation green sustainable technology. Most semiconductor-based photonics and electronics, however, currently face both technical and economic challenges to be further competitive for current and next-generation applications.

The semiconductor devices discussed herein are fabricated using methods aimed to improve performance, affordability, and functionality of these devices, for example, for devices such as the types of semiconductors to be used in green and information systems. This disclosure discusses several examples of technologies where the concept of this disclosure can be applied.

Referring to the cross-sectional structure 100 of FIG. 1, an un-bent LED structure 100 is illustrated for reference. The structure 100 comprises a light-generation active region 114 comprising a plurality of pairs of layers that each comprise a quantum well (QW) (108) and quantum-well barrier (QWB) (102). The light-active region 114 is sandwiched between two regions of p-type layers (112) and n-type layers (104) with positively- and negatively-charged conducting properties, respectively. The devices also include a p-type electrode (110) and an n-type electrode (106). It is appreciated that the thicknesses and relative thicknesses of the attributes of the LED structure 100 are merely illustrative and may not represent thicknesses of each of the discussed layers.

By employing various embodiments of the present disclosure, the efficiencies of light-emitting devices including LEDs and laser diodes can be improved, including a new method of tuning colors of these light-emitting devices. In an embodiment, an LED device according to embodiments of the present disclosure may comprise the same components as FIG. 1 but may be in a bend-up or a bend-down strain condition as illustrated in FIGS. 11B, 11C, 12A, and 12B, and may be configured to comprise a fixed strain or a variable strain. As used herein, the term "bend up" condition refers to a device that is concave relative to its angle to a packaging substrate (e.g., FIGS. 11B and 12A), and the term "bend-down" refers to a device that is convex relative to a packaging substrate (e.g., FIGS. 11C and 12B).

Semiconductor devices are also used in power switching and conversion applications in the field of 'power' electronics. Silicon (Si) semiconductors, despite inefficiencies in conversion and switching of the energies, have been a dominant material in such applications. New applications where Si semiconductors are desirable to use may employ significantly higher current and voltage handling capacities than conventional applications. As discussed herein, devices based on GaN and other materials discussed herein may be more energy efficient alternative to current devices using Si. Among the many fundamental properties of GaN and related materials, a high breakdown field and a high saturation velocity can be used for high voltage and high current applications, respectively. GaN-based transistors and diodes may therefore be desirable components in many systems used for power switching and conversion.

In some embodiments, for power applications, it is desirable that the device is turned off when electrical power is not being applied to the device. In other words, for power switching applications, the "on/off" or power switch needs to be set to "off," without power, for the safer operation of switches. This is called a "normally-off" operation and is better for "fail-safe" mode operation when the main current flowing through the switch is to be stopped. When a device is in an a fail-safe operation mode, the control electronics do not function properly without power.

FIG. 2 illustrates a cross-section of an un-bent transistor 200 that may be strained according to certain embodiments of the present disclosure. The transistor shown as the cross-section 200 may comprise GaN materials or other materials as discussed such as heterostructure field effect transistors (HFETs), also known as high-electron mobility transistors (HEMT). The HFETs may have a cross-sectional structure 200 as discussed below and are not in a strained bend-up or bend-down condition. In an embodiment, a first layer 208 comprises $In_xAl_yGa_{1-x-y}N$ materials and a second layer 202 comprises GaN. In alternate embodiments, the first layer 208 comprises $In_xAl_yGa_{1-x-y}N$, where x may range from 0 to about 1, and y may be from 0 to 1. The second layer 202 comprises $Mg_xZn_yCd_{1-x-y}O$, where x may range from 0 to about 1, and y may be from 0 to 1. In alternate embodiments, the second layer 202 comprises $In_xAl_yGa_{1-x-y}N$ and the first layer 208 comprises $Mg_xZn_yCd_{1-x-y}O$. In some embodiments x+y<1, and either x or y may be equal to 0.

Near the interface of the first and the second layers 208 and 202, a high concentration (or density) of electrons is formed as a channel 210. This channel 210 may be typically referred to as 2-dimensional electron gas (2-DEG). Due to formation of the 2-DEG, the channel 210 for current flow exists between a source electrode 204 and a drain electrode 206 without applying bias at a gate 212. The channel 210 is a region formed by the interface of layers 202 and 208 and is indicated in FIG. 2 with shading for illustrative purposes. A "normally-on" operation may be described as when the channel 210 can be off only when a gate 212 has applied negative biases. There are different ways to achieve "normally-off" operation in GaN and MgZnCdO-based HFETs. Discussed herein are embodiments of a method to achieve normally-off conditions and to control the currents between a source 204 and a drain 206 in an improved LED structure.

The systems and methods discussed herein may provide (1) improved efficiency of light-emitting devices beyond the limit of current technology platform having fixed internal strain; (2) Color changing functionality of light-emitting devices consisting of the same materials; (3) Normally-off (enhancement mode) transistors to be used in power electronics for fail-safe operations; and (4) New electro-mechanical devices comprising a channel controlled by external strain applied to the FET structure either before or after assembly, in contrast with the use gate bias to control the channel as in the case of traditional FETs.

Design and Process

In an embodiment, flexible devices were fabricated using inorganic semiconductors. Subsequently, external strain was applied to semiconductor structures previously grown on non-flexible single-crystal substrates. Historically, applying strain to semiconductor was challenging due to the brittle nature of the semiconductor materials and their substrates. The bend-up and bend-down conditions discussed herein were achieved when the strain was applied externally to the entire semiconductor structure, so the application of strain must be done in a way as to not compromise the components of the structure, including the sometimes brittle substrate. As shown and discussed herein, when epitaxial structures become thin films (i.e., films comprising a thickness less than about 5 μm) and are fabricated without using rigid substrates, the semiconductor layers on flexible substrates can withstand a high degree of strain, at least some of which is retained in the structures, without comprising the integrity of the structures.

The external strain applied herein was applied to two different types of structures, light-emitting diodes (LEDs) and heterostructure field-effect transistors (HFETs), discussed above, which may be collectively referred to as FETs since the external strain may be applied in other embodiments to other types of FET devices.

Figure 13:
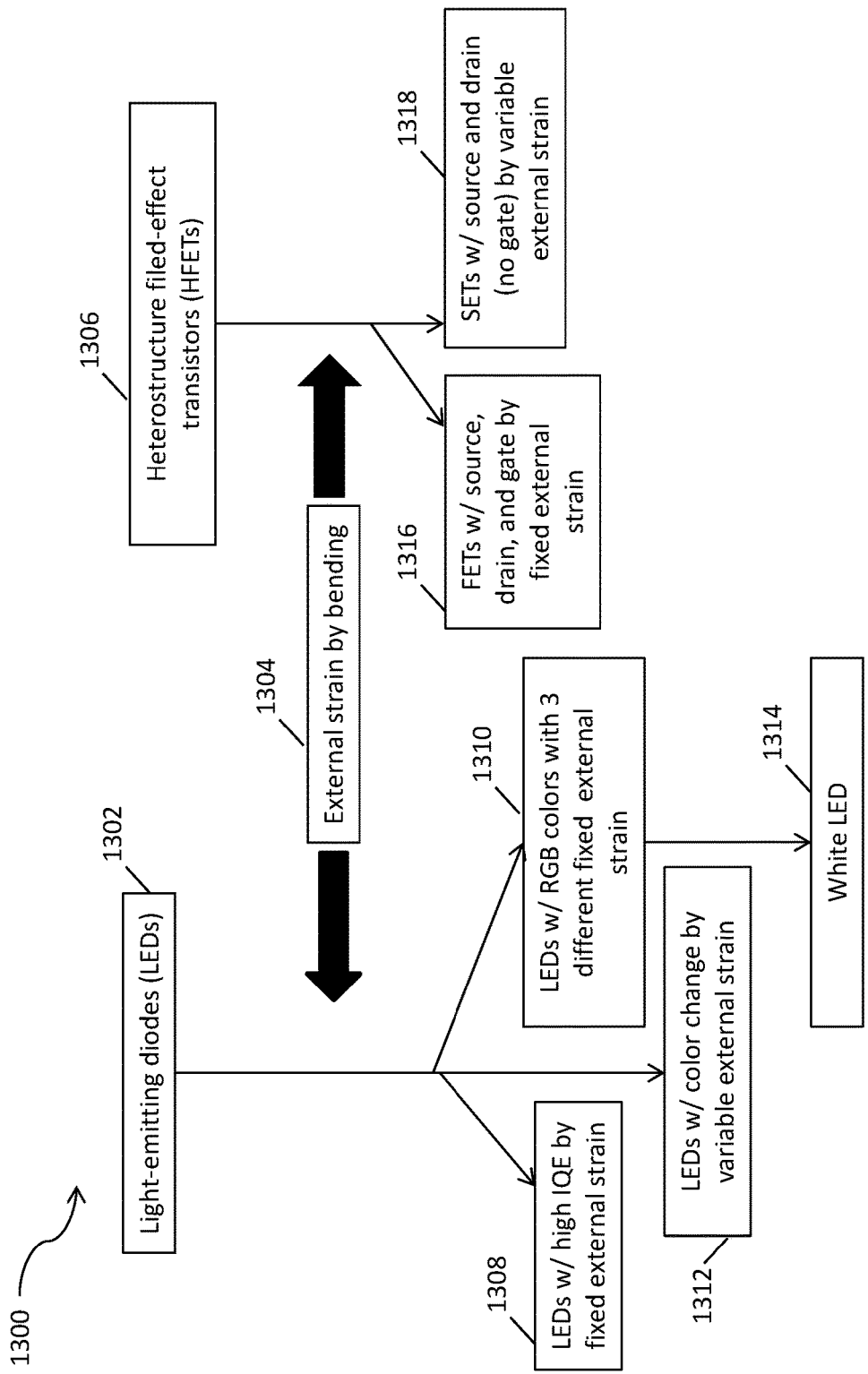
FIG. 13 is a diagram of exemplary embodiments of externally strained device types.

FIG. 13 is a diagram 1300 of exemplary embodiments of externally strained device types. FIG. 13 is provided as a high-level overview of the devices discussed herein, and illustrates that there may be a plurality of LEDs at block 1302, and when an external strain is applied as discussed above to create a bend-up or a bend-down structure, a plurality of LEDs may be formed at block 1308 that have a high IQE and a fixed external strain, and a plurality of LEDs may be formed at block 1310 that comprise RGB colors with different fixed external strains, and some at block 1314 that are white (not RGB) LED with external strains. In an embodiment, there may also be a plurality of LED formed at block 1312 that can have their colors changed by a variable external strain as discussed above. At block 1306, there may be a plurality of HFETs, and when the external strain is applied by bending the FET structures at block 1304, a plurality of FETs comprising source drains and gates are formed at block 1316 with a fixed external strain, and a plurality of SETs comprising a source and a drain but no gate, and comprising variable external strain.

Figure 3:
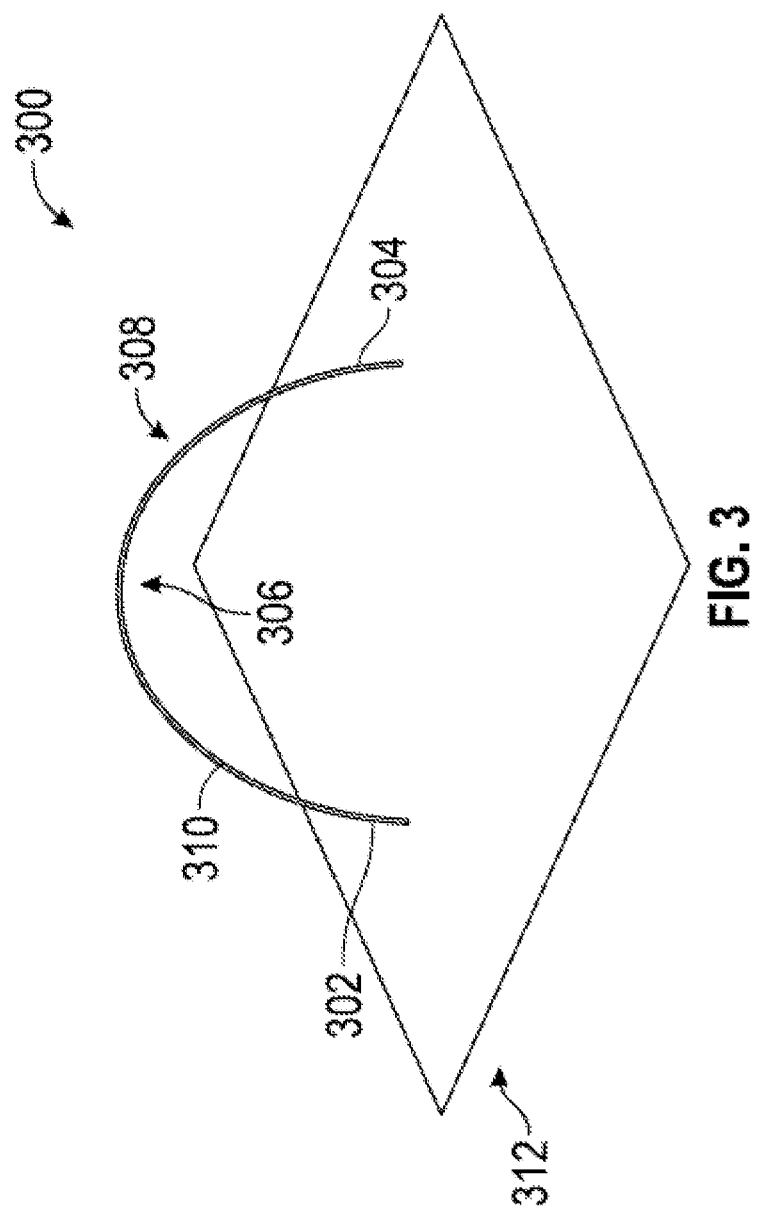
FIG. 3 is an illustration of the application of strain to an LED or HFET assembly according to certain embodiments of the present disclosure prior to the assembly being packaged/disposed in the packaging substrate.

Referring now to FIG. 3, conventionally, flexible semiconductor structures were focused on flexibility and stretchability of devices to be employed in curved, foldable, or rollable applications. FIG. 3 illustrates the flexible properties of an LED or FET, i.e., the ability of the LED or FET device to be externally strained is leveraged to improve and extend device functionality according to the embodiments discussed herein. The devices manufactured according to embodiments of the present disclosure are in contrast to those flexible semiconductors fabricated for use in applications that required the flexibility of the packaged/mounted device itself. However, in some applications, externally strained devices may be introduced to applications where the packaged/mounted device is flexible, but the devices may be externally strained prior to disposal in the packaging. In schematic 300, strain is applied to an LED or FET or other assembly as discussed herein, the strain may be applied at two or more points from two directions that may comprise mirrored angles 302 and 304, or may have strain applied in other directions 306, 308, 310, such strain may be uniaxial, biaxial, or multi-axial, and may generate a shape that is concave (as illustrated) or convex (not pictured) with respect to a normal plane 312.

Applying uniaxial or biaxial strain (stretching) on the flexible semiconductor structures may be challenging due to the complexity of FET and LED structures. In an embodiment, bending was utilized to apply external strain, for modification of performance and functionality. The bending strain can be applied prior to packaging/seating the devices, but may also be easily applied in real-world devices during packaging. As used herein, the term "packaging" may mean the assembly of an LED, FET, or other such semiconductor structure on to a substrate, that is, the coupling of a first structure to a second structure.

Light-emitting Devices:

In light-emitting devices, QCSE may present a challenge. The total polarization of a QW by external strain is:

$$P_{ex} = P_{sp},QW - P_{sp},QWB + P_{pz},QW_{(\varepsilon 1)} - P_{pz},QWB_{(\varepsilon 2)} \quad (1a)$$

$$P_{ex} = P_{total},QW - P_{total},QWB = \Delta P_{total} \quad (1b)$$

where $P_{sp}$, QW and $P_{sp}$, QWB are spontaneous polarization fields of QW and QWB, respectively; $P_{pz}$, QW is a piezoelectric polarization; $P_{pz}$, QWB is a piezoelectric polarization field of QWB; and $_{\varepsilon 1}$ and $_{\varepsilon 2}$ strains are from combinations of lattice mismatch and external bending in QW and QWB, respectively.

Figure 4:
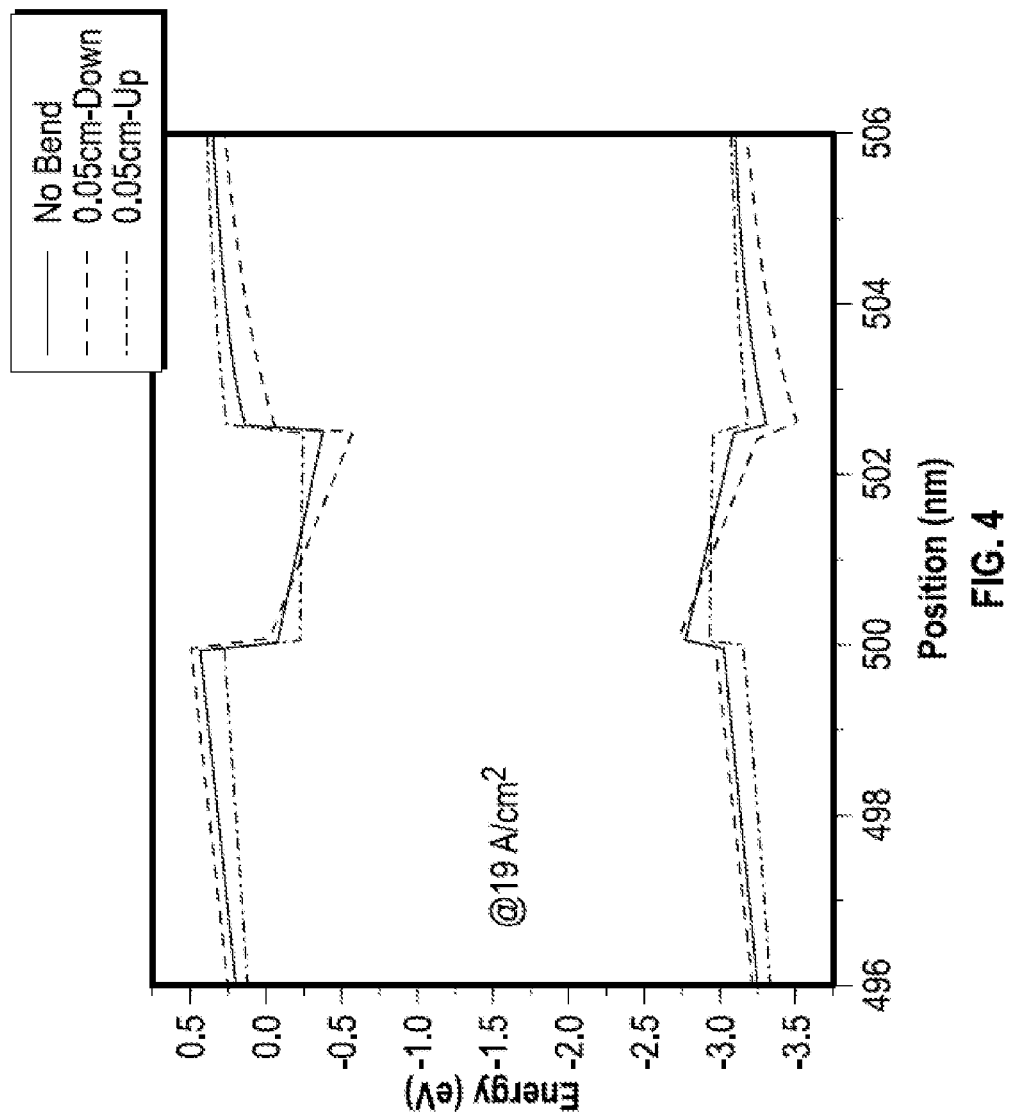
FIG. 4 is a graph of equilibrium electronic band diagrams of a quantum-well (QW)-region of a light-active region in an LED with various bending conditions according to certain embodiments of the present disclosure.

FIG. 4 illustrates the QCSE for LEDs in three bending conditions: that have not been bent, that have been bent up ("bend-up condition") and that have been bent down (bend-down condition"). The condition of bend-up and bend-down can be changed depending on the location of QWs and location of a neutral plane of the whole structure where net strain is zero during bending. External bending strain changes the QCSE, as illustrated in FIG. 4. The results for the no-bend condition (i.e., no strain has been applied to the LED) indicates the significant QCSE evidenced from band tilt in the QW region. Conduction and valence bands become more flattened and more tilted for bend-up and bend-down conditions, respectively. The total polarization difference between QW and QWB in Eq. 1a and 1b is used to address the induced band tilt and resulting QCSE. In particular, when the bend-up conditions, the QCSE becomes mitigated. When charged carriers are injected, spatial distribution of electrons and holes and effective bandgap energies are dependent on the band tilt in the QW.

Figure 5:
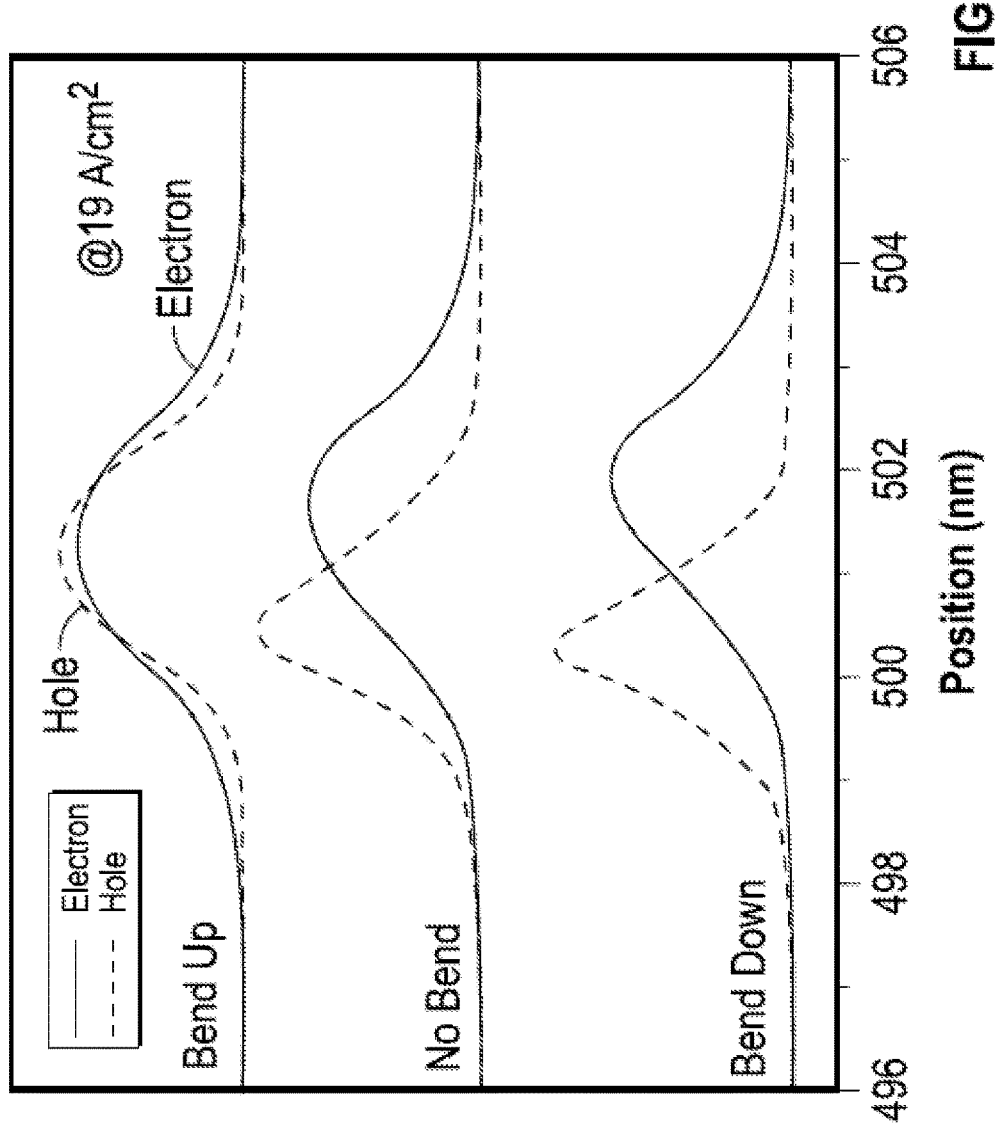
FIG. 5 is a graph illustrating wave functions of electrons and holes in the QW with representative bending conditions at a current density, J~20 A/cm$^2$ in an LED structure.

FIG. 5 illustrates wave functions of electrons and holes. In the bend-up condition where strain was applied to the semiconductor structure and substrate, the wave functions of the electrons and the wave functions of the holes move closer to each other and are more overlapping than those structures fabricated in the bend-down condition. In contrast, the wave functions and holes are farther separated with increasing strain applied from a no-bend condition to the bend-down condition. The degree of separation in the wave functions affects the oscillator strength of carriers; hence, a radiative recombination probability and a radiative recombination rate. A radiative recombination rate competing against other recombination rates, i.e., rates of different non-radiative recombinations including Shockley-Read-Hall and Auger recombinations, determines internal quantum efficiency (IQE) of the light emitters. The IQE was improved by increasing a radiative recombination rate while minimizing non-radiative recombination rates. The modification in QCSE changes dominant transition energies, and therefore also the light emission wavelengths and colors.

Figure 6:
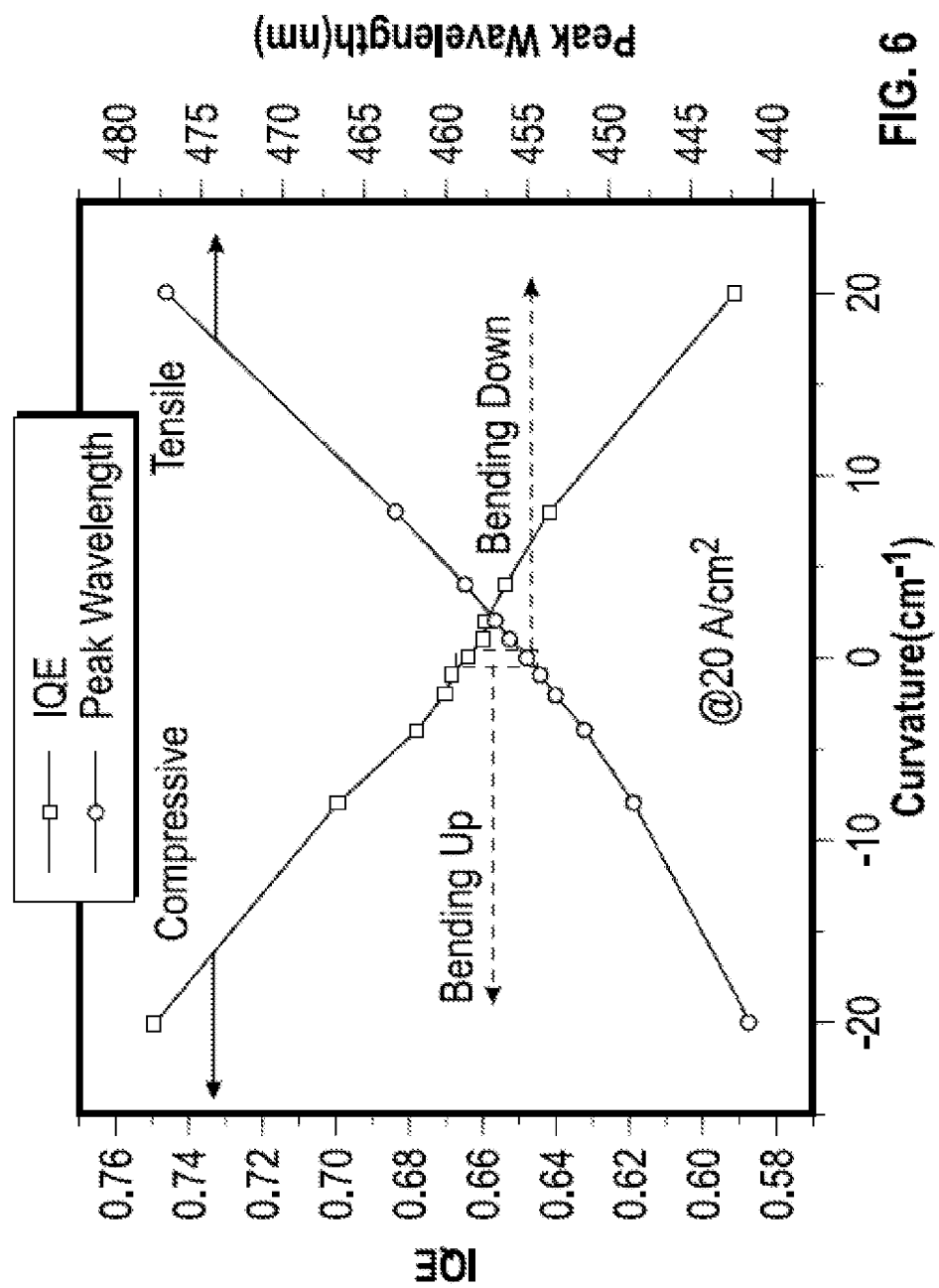
FIG. 6 is a graph illustrating changes in the internal quantum efficiency (IQE) and peak emission wavelength of a QW structure as a function of curvature, as an example of IQE improvement and color tunability in the case of visible LEDs.

Referring now to FIG. 6, by applying external compressive strain (bend-up conditions), the IQE improves comparing to a no-bending condition and it keeps increasing with increasing curvature. Also, mitigated QCSE by external compressive strain makes effective bandgap wider. When bending condition changes from no bend to bend-up condition, emission peak from the QW shifts toward shorter wavelength (blue shift). On the other hand, bending down induces red-shift (peak wavelength toward longer wavelength). Computational demonstration on the effect of external strain shows that bending the LED by external loading can improve performance and change the color of light emitters. This finding is utilized in further enhancement of IQE of LED-based SSL lamps.

Figure 7:
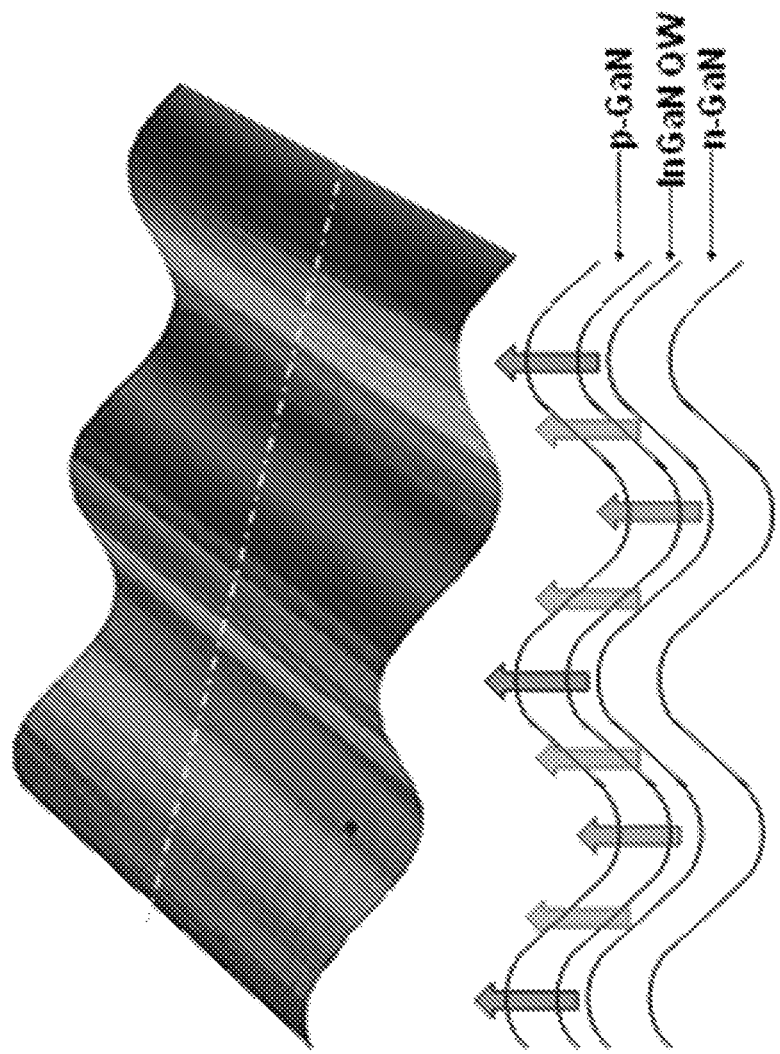
FIG. 7 is a schematic illustration of multi-color LEDs with the same QW active region by modulating external strains for the generation of white light.

FIG. 7 is a schematic illustration of multi-color LEDs with the same QW active region by modulating external strains. This packaging substrate is different from the substrate used for deposition of semiconductor materials and structures because the packaging substrate is not flat, rather, it comprises a curve that matches the strain induced in an LED by bending (application of external strain). By changing direction and degree of external bending strain, the color of flexible LEDs can be tuned. This color changing characteristics can also be utilized in white LED lamps by combining red (R), green (G), and blue (B) colors on the same chip that can replace phosphor-converted LEDs (PC-LEDs) used in white SSL lamps. RGB-LED-combination LEDs have the potential for higher efficiency, while being less expensive than PC-LEDs. Higher cost is related to integration of multiple LED chips having different colors. Described herein is the concept of employing different color LEDs on a same chip using the same LED structure, which is expected to lower the manufacturing cost.

Field-effect transistors and strain-effect transistors (SETs): Turning back to FIG. 2, III-N-based HFETs have a channel with a 2-DEG (210). This 2-DEG 210 is formed by polarization effects and the concentration and mobility of the electrons in 2-DEG 210 governs transfer characteristics of the transistors. For an FET, the channel may be controlled by an electric field through gate bias, and for an SET, the channel is controlled by strain without bias on the gate.

Figure 8:
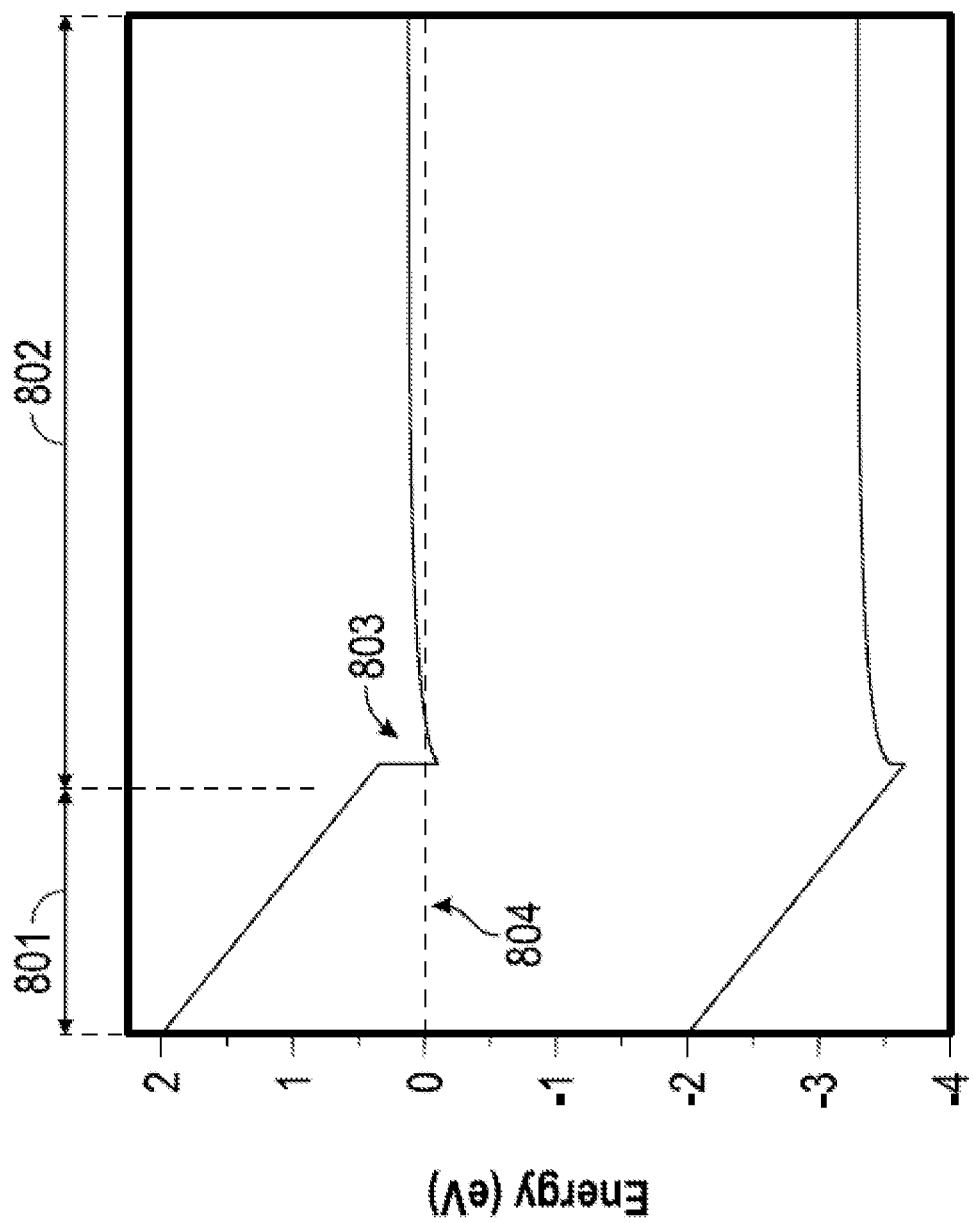
FIG. 8 shows an electronic band diagram of InAlGaN/GaN HFETs fabricated according to certain embodiments of the present disclosure.

Referring now to FIG. 2 and FIG. 8, the electronic band diagram of InAlGaN/GaN HFETs comprises an InAlGaN Schottky barrier layer (indicated by 801, and corresponding to the first layer 208) and a GaN layer (802, corresponding to the second layer 202).

The heterostructure inherently forms a triangular QW at the interface and 2-DEG (indicted by 803, corresponding to the 2-DEG 210) is formed when the depth of the QW is lower than the Fermi level 804. The concentration of 2-DEG 803 increases with increasing depth of QW below Fermi level. In the case of HFETs on nonflexible substrates, the 2-DEG 803 density (concentration) is fixed once the epitaxial layer structure is designed. Transfer characteristics of the channel are controlled by the field applied on the gate in traditional (conventional) FETs. As discussed herein, the 2-DEG 803 density can be further engineered by applying external strain to an FET as opposed to using the gate.

Figure 9:
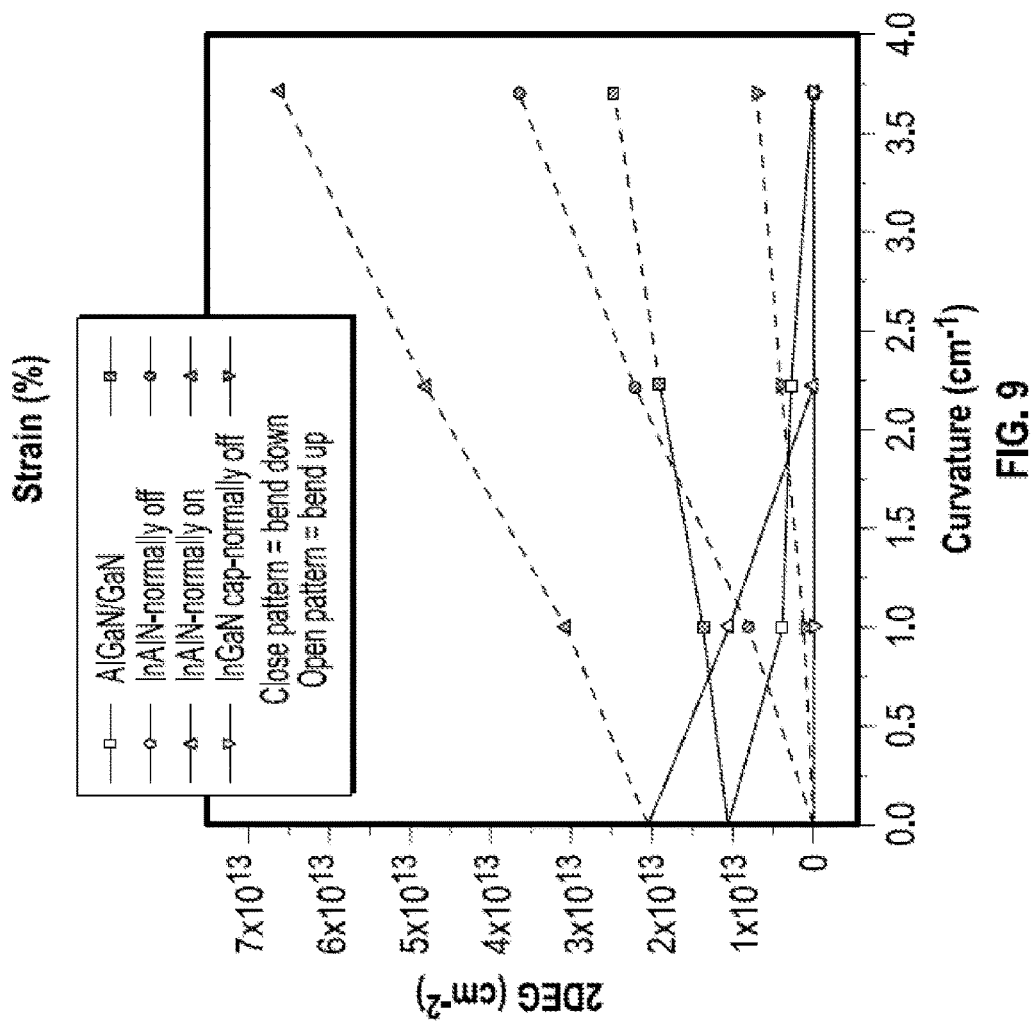
FIG. 9 shows a 2-DEG density change with various curvature changes (bending strain) for samples fabricated according to embodiments of the present disclosure.

Referring now to FIG. 9, for an $In_{0.32}Al_{0.72}N/GaN$ normally-off HFET, a channel starts to form with a higher density of 2-DEG with increasing curvature of devices strained to bend-up conditions (indicated by the open circles). The range of modulation of 2-DEG density with curvature was highest in the case of an $In_{0.2}Al_{0.8}N/GaN$ normally-on HFET (indicated by the open and closed triangles), while that of an $In_{0.2}Ga_{0.8}N/Al_{0.15}Ga_{0.85}N/GaN$ normally-off HFET is negligible (indicated by the open and closed inverse triangles). The effects of external strain on 2-DEG may be due I part to a degree and/or direction of bending/external strain applied, which may collectively be referred to as a "bending status," and the Schottky barrier, which is the potential energy barrier for electrons suitable for use as a diode and formed at a metal-semiconductor interface.

Threshold voltage, $V_{th}$, of the III-N HFETs can be expressed as:

$$V_{th} = \phi_B/e - d\sigma/\varepsilon - \Delta E_c/e + E_{F0}/e \qquad (2)$$

where $\phi_B$ is a metal-semiconductor Schottky barrier height; $\sigma$ a charge induced at the interface by polarizations, d thickness of the InAlGaN layer, $\Delta E_c$ a conduction-band offset, $E_{F0}$ an electron energy difference between Fermi level and the conduction band edge of the GaN layer, e the elementary electron charge, and $\phi$a dielectric constant of InAlGaN. When $V_{th}$ is negative value, the transistor is operated in a depletion (normally-on) mode. When $V_{th}$ is positive value, the transistor is operated in an enhancement (normally-off) mode. By modifying strain, charge ($\sigma$) is modified to engineer threshold voltage of devices, as described in Eq. 2. In an embodiment, a 2-DEG channel can be controlled by bending strain using an optimized structure and without employing a gate bias. This effect may be employed to change the operation mode of HFET between the normally-off mode and the normally-on mode. Actively controlled bending can also be engineered to realize strain-effect transistors (SETs).

Turning now to FIG. 10A, the schematic cross-section 1000A of packaged/mounted device comprises a structure 1006 which may be an FET, SET or an LED structure in a bend-up condition and disposed on and bonded to a packaging substrate 1002 with a curved surface having an optimized bending strain. In an embodiment, the "optimized bending strain" is defined as a minimum strain and/or a range of bending strain induced in the structure 1006 that is required to generate a desired effect for an end application. This bending strain may be induced using one or more strain cycles, which may be of similar or varying loads and times. In various embodiments, the integration of LED or FET structures 1006 and packaging substrates 1002 may be described as mounting or disposal and may be achieved by chip bonding and separation of a substrate that was used for deposition of structure.

As used herein, the term "strain cycle" may be employed to describe when biaxial, uniaxial, or combinations of both strains are applied to the FET structure for a predetermined period of time and removed from the LED or FET structure 1006 or 1008 (FIG. 10B below) in whole or in part after the predetermined period of time. Strain may be applied to an FET structure in a single strain cycle or in multiple strain cycles, and it may be applied to the FET structure in a contiguous process of assembly into a packaging structure 1002, or may be pre-strained and then later assembled. The packaging substrates may also be strained in one or more cycles, and the assembly process of the semiconductor structure 1006 (or 1008) to the packaging substrate 1002 (or 1004) may in some embodiments induce additional strain in one or both components.

In an embodiment where a plurality of strain cycles are employed, each strain cycle may use the same or different amounts of strain, may be applied in the same or different directions or in multiple directions simultaneously or near-simultaneously, and may be employed for varying amounts of time depending upon the strain desired for the end application and the composition of the LED or FET structure 1006, 1008 (FIG. 10B), or others.

In an embodiment, the bend (curve) in FIG. 10A of the packaging structure 1002 is concave, and the LED or FET 1006 may be pre-strained prior to being disposed/seated/coupled to the packaging structure 1002. This pre-strain may be applied to bend the semiconductor structure 1006 to fit into the packaging structure 1002, where the strain will be maintained. In an alternate embodiment, the pre-strain may be applied prior to disposal in part, with the remainder of the strain being applied and maintained after disposal of the LED or FET semiconductor structure 1006 on the packaging structure 1002.

In an alternate embodiment in FIG. 10B, the structure 1000B comprises an LED or an FET structure (1008) and on a packaging substrate (1004) with a curved surface having an optimized bending strain. The bend in FIG. 10B of the packaging structure 1004 is convex, and the LED or FET 1108 may be pre-strained in prior to being disposed/seated/coupled to the packaging structure 1004. This pre-strain may be applied to bend the LED or FET structure 1008 to match the strain (bend/curvature) of the packaging structure 1004, where the strain will be maintained once the FET structure 1008 is disposed. In an alternate embodiment, the pre-strain may be applied prior to disposal in part, with the remainder of the strain being applied and maintained after disposal of the FET 1008 on the packaging structure 1004.

Turning to FIG. 11A, in an embodiment, the strain-effect transistor (SET) 1100A is first shown in an unbent condition to illustrate the relative position of components, and comprises a first layer 1106, which may comprise $In_xAl_yGa_{1-x-y}N$ materials and a second layer 1102 which may comprise GaN. It is appreciated that the SET 1100 is illustrated in FIG. 11A in an un-strained condition of an SET prior to bending depending upon the embodiment. The SET 1100 may be configured, due to the absence of a gate similar to the gate 212 in FIG. 2, to be a fixed strain SET. FIGS. 11B and 11C illustrate the bend-up (FIG. 11B) and bend-down (FIG. 11C) conditions for SET 1100B and SET 1100C, respectively. SET 1100B and SET 1100C which are variable-strain SETs, the features are common to the SETs in all bending conditions and are discussed below. In FIG. 11B, near the interface of the first layer 1106 and the second layer 1102, high concentration of electrons is formed as a channel (1108). The structure also contains source (1104) and drain (1110) electrode. The structure is similar to HFET structure of FIG.

2; however, it does not have the gate (212). Instead of using a gate (212), the channel is modulated by external strain, not by gate voltage in SETs. In an embodiment, the SET 1100A may be strained to a bend-up 1100B or a bend-down 1100C condition using one cycle of strain applied for a predetermined time. In an alternate embodiment, multiple strain cycles may be applied to the SET 1100A, these strain cycles may be for the same, similar, or differing amounts of strain and may be applied for different periods of time, depending upon the composition of the SET 1100A and the bend-up or bend-down condition of the substrate or packaging structure or the degree of strain appropriate for the end application.

Figure 12A:
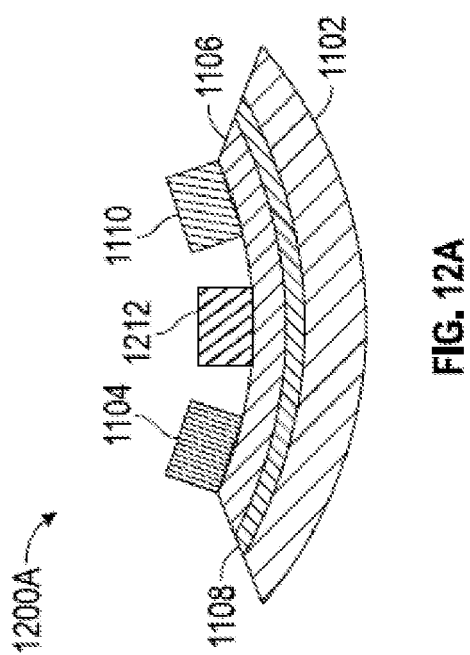
FIGS. 12A-12B illustrate the bend-up, and bend-down conditions of HFET structures fabricated according to embodiments of the present disclosure.
Figure 12B:
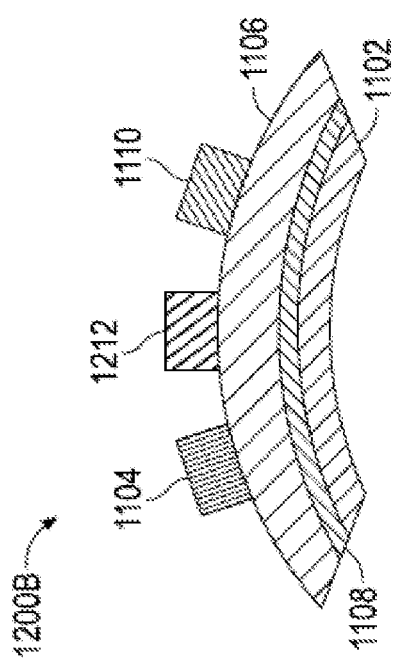

In an embodiment, as illustrated in FIGS. 12A and 12B, an HFET (FET) structure may comprise the gate 212 in a strained condition similar to the bend-up or bend-down conditions 1200A and 1200B, this strained condition may be which may be referred to as a fixed strain or a fixed external strain, and an LED structure may also comprise a similar fixed strain in a bend-up or bend-down condition. The externally strained device embodiments are illustrated in FIGS. 12A and 12B, where the FET (or SET) cross sections 1200A and 1200B illustrate FET (or SETs) in the bend-up (1200A) or bend-down (1200B) conditions with a gate 1212. Therefore, these embodiments are fixed strain embodiments. In alternate embodiments, the FET and LED structures discussed herein may not comprise this gate 212 and may instead comprise strain that may be referred to as "variable strain" or "variable external strain." "Variable strain" is the term used to describe a strained device that comprises an amount of strain induced prior to and/or during coupling with the substrate that can be varied subsequent to coupling. The variable strain may be employed to use the channel 1108 to modulate the current.

In an embodiment, a single SET, FET, or LED may be disposed in a housing to compose a device used for light generation and/or current modulation. In an alternate embodiment, a plurality of SET, FET, or LEDs may be disposed simultaneously or in sets of at least two at a time on a packaging substrate comprising a plurality of housings for one or more devices used for light generation and/or modulation.

Exemplary embodiments are disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, ..., 50 percent, 51 percent, 52 percent, ..., 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of."

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

The invention claimed is:

1. A mounted field-effect transistor comprising:
    a layered structure comprising a channel at the interface of a first layer and a second layer, wherein the channel comprises a high density of electrons, and wherein the first layer consists of a material according to a first formula $In_xAl_yGa_{1-x-y}N$ or a second formula $Mg_xZn_yCd_{1-x-y}O$;
    at least a first and a second electrode in contact with the first layer and free of contact with the second layer,
    wherein the layered structure is in one of a bend-up or bend-down condition and comprises a predetermined amount of strain as a result of external strain applied to the entire layered structure by bending; and
    a packaging substrate, wherein the layered structure is disposed in contact with the packaging substrate and retains at least some of the predetermined amount of strain subsequent to disposal, wherein the packaging substrate is not bent and comprises a curved surface, and wherein the layered structure is disposed in contact with the curved surface of the packaging substrate.

2. The field-effect transistor of claim 1 further comprising a third electrode disposed between the first and second electrodes, wherein the third electrode is in contact with the first layer but not with the second layer.

3. The field-effect transistor of claim 1, wherein the strain is a fixed strain.

4. The field-effect transistor of claim 1, wherein field-effect transistor comprises no gate electrode and is a strain-effect transistor comprising a variable strain, and wherein an electrical current in the strain-effect transistor is modulated by adjusting the variable strain on the channel.

5. The field-effect transistor of claim 1, wherein the second layer comprises a material according to the first formula of $In_xAl_yGa_{1-x-y}N$ or the second formula $Mg_xZn_yCd_{1-x-y}O$, and different from the material of the first layer.

6. The field-effect transistor of claim 1, wherein the at least the first and second electrodes comprise a source electrode and a drain electrode.

7. The field-effect transistor of claim 1, wherein the strain is at least one of uniaxial and biaxial.

8. The field-effect transistor of claim 1, wherein the predetermined amount of strain is a result of an induced strain resulting from more than a single cycle of strain, wherein a single strain cycle comprises applying a strain for a first predetermined amount of time and then removing the strain in whole or in part for a second predetermined amount of time.

9. The field effect transistor of claim 1, operable to modulate current in the channel by varying an amount of external strain on the field effect transistor.

10. The field effect transistor of claim 1, wherein the bend-up or bend-down condition matches a curvature of the packaging substrate.

11. The field effect transistor of claim 8, wherein the more than the single cycle of strain are of varying loads.

12. The field effect transistor of claim 1, wherein either of x or y is equal to 0 in the first formula and/or the second formula.

13. The field effect transistor of claim 1, (i) wherein the first layer consists of the material according to the second formula $Mg_xZn_yCd_{1-x-y}O$, (ii) wherein the second layer comprises or consists of the material according to the second formula $Mg_xZn_yCd_{1-x-y}O$, or (iii) both (i) and (ii).

14. The field effect transistor of claim 1, wherein the curved surface has a complementary shape to that of the layered structure.

15. The field effect transistor of claim 1, wherein the layered structure is in the one of the bend-up or the bend-down condition and comprises the predetermined amount of strain as the result of external strain applied at two or more points.

* * * * *